(12) United States Patent
Shaviv et al.

(10) Patent No.: US 9,768,060 B2
(45) Date of Patent: Sep. 19, 2017

(54) SYSTEMS AND METHODS FOR ELECTROCHEMICAL DEPOSITION ON A WORKPIECE INCLUDING REMOVING CONTAMINATION FROM SEED LAYER SURFACE PRIOR TO ECD

(71) Applicant: APPLIED Materials, Inc., Santa Clara, CA (US)

(72) Inventors: Roey Shaviv, Palo Alto, CA (US); Ismail T. Emesh, Sunnyvale, CA (US)

(73) Assignee: APPLIED Materials, Inc., Santa Clara, CA (US)

( * ) Notice: Subject to any disclaimer, the term of this patent is extended or adjusted under 35 U.S.C. 154(b) by 0 days.

(21) Appl. No.: 14/527,671

(22) Filed: Oct. 29, 2014

(65) Prior Publication Data
US 2016/0126104 A1 May 5, 2016

(51) Int. Cl.
H01L 21/768 (2006.01)
C25D 7/12 (2006.01)
C25D 5/34 (2006.01)
C25D 17/00 (2006.01)
(Continued)

(52) U.S. Cl.
CPC .......... *H01L 21/76843* (2013.01); *C25D 5/34* (2013.01); *C25D 7/123* (2013.01); *C25D 17/001* (2013.01); *H01L 21/02068* (2013.01); *H01L 21/6723* (2013.01); *H01L 21/76862* (2013.01); *H01L 21/76864* (2013.01); *H01L 21/76873* (2013.01)

(58) Field of Classification Search
None
See application file for complete search history.

(56) References Cited

U.S. PATENT DOCUMENTS 6,475,902 B1 * 11/2002 Hausmann ............ C23C 16/34
257/E21.17
6,946,601 B1 9/2005 Lee
(Continued)

OTHER PUBLICATIONS

Beyer, G.P., et al., "Studies of Copper Surfaces Modified by Thermal and Plasma Treatments," Proceedings of the 2000 Materials Research Society (MRS) Spring Meeting & Exhibit, San Francisco, Apr. 24-28, 2000, "Symposium D: Materials, Technology, & Reliability for Advanced Interconnects and Low-K Dielectrics," vol. 612, pp. D9.17.1-D9.17.6.
(Continued)

*Primary Examiner* — Bilkis Jahan
(74) *Attorney, Agent, or Firm* — Christensen O'Connor Johnson Kindness PLLC

(57) ABSTRACT

In one embodiment of the present disclosure, a method for electrochemical deposition on a workpiece includes (a) obtaining a workpiece including a feature; (b) depositing a first conductive layer in the feature; (c) moving the workpiece to an integrated electrochemical deposition plating tool configured for hydrogen radical H* surface treatment and electrochemical deposition; (d) treating the first conductive layer using a hydrogen radical H* surface treatment in a treatment chamber of the plating tool to produce a treated first conductive layer; and (e) maintaining the workpiece in the same plating tool and depositing a second conductive layer in the feature on the treated first conductive layer in an electrochemical deposition chamber of the plating tool.

18 Claims, 8 Drawing Sheets

(51) Int. Cl.
*H01L 21/02* (2006.01)
*H01L 21/67* (2006.01)

(56) References Cited

U.S. PATENT DOCUMENTS

| | | | |
|---|---|---|---|
| 6,998,337 B1* | 2/2006 | Tran | H01L 21/2885 257/E21.175 |
| 7,067,441 B2* | 6/2006 | Smith | G03F 7/427 257/E21.228 |
| 7,256,111 B2 | 8/2007 | Lopatin | |
| 2001/0005056 A1* | 6/2001 | Cohen | H01L 21/76843 257/751 |
| 2002/0076929 A1* | 6/2002 | Lu | H01L 21/02068 438/687 |
| 2004/0118697 A1* | 6/2004 | Wen | C23C 14/58 205/215 |
| 2005/0081744 A1* | 4/2005 | Klocke | C25D 3/38 106/1.18 |
| 2005/0110147 A1* | 5/2005 | Wu | H01L 21/76807 257/758 |
| 2006/0178007 A1* | 8/2006 | Nakamura | H01L 21/76843 438/675 |
| 2007/0141818 A1* | 6/2007 | Basol | C25D 5/04 438/584 |
| 2008/0081464 A1* | 4/2008 | Matsuda | H01L 21/02063 438/660 |
| 2014/0256128 A1* | 9/2014 | Spurlin | H01L 21/76861 438/643 |

OTHER PUBLICATIONS

Kirsch, P.D., and J.G. Ekerdt, "Chemical and Thermal Reduction of Thin Films of Copper (II) Oxide and Copper (I) Oxide," Journal of Applied Physics 90(8):4256-4264, Oct. 2001.

Kondoh, E., et al., "Reduction of Thin Oxidized Copper Films Using a Hot-Filament Hydrogen Radical Source," Journal of Vacuum Science & Technology A: Vacuum, Surfaces, and Films 25(3):415-420, May/Jun. 2007.

Ueno, K, et al., "Cleaning of $CHF_3$ Plasma-Etched $SiO_2$/SiN/Cu via Structures Using a Hydrogen Plasma, an Oxygen Plasma, and Hexafluoroacetylacetone Vapors," Journal of Vacuum Science & Technology B: Microelectronics and Nanometer Structures 16(6):2986-2995, Nov./Dec. 1998.

* cited by examiner

SYSTEMS AND METHODS FOR ELECTROCHEMICAL DEPOSITION ON A WORKPIECE INCLUDING REMOVING CONTAMINATION FROM SEED LAYER SURFACE PRIOR TO ECD

BACKGROUND

In general, semiconductor devices are manufactured by fabrication processes forming electric circuits on a semiconductor substrate, such as a silicon wafer. Metals, like copper, are commonly deposited on the substrate to form the electric circuits. A barrier metal layer can be used to prevent the diffusion of copper ions into the surrounding materials. A seed layer can be subsequently deposited on the barrier layer to facilitate copper interconnect plating.

Recently, other metals, such as ruthenium and cobalt, have been introduced as seed layer materials to complement commonly used copper seed layers. Ruthenium, cobalt, and copper may be used separately or in combination to form seed layer stacks. One drawback of using ruthenium or cobalt as seed layer material is the tendency to oxidize quickly. The native oxide layer formed on a seed layer is not an optimal surface for interconnect metallization plating, particularly for small-sized damascene fill features (such as vias and trenches), for example, features measuring less than 50 nm in width. Therefore, there are advantages to reducing the oxide layer prior to initiating interconnect metallization deposition processes.

Therefore, there exists a need for an improved process for reducing the oxide layer formed on a seed layer.

SUMMARY

The summary is provided to introduce a selection of concepts in a simplified form further described below in the Detailed Description. The summary is not intended to identify key features of the claimed subject matter, nor to be used as an aid in determining the scope of the claimed subject matter.

In accordance with one embodiment of the present disclosure, a method for metal deposition on a workpiece is provided. The method includes (a) obtaining a workpiece including a feature; (b) depositing a first conductive layer in the feature; (c) moving the workpiece to an integrated electrochemical deposition plating tool configured for hydrogen radical H* surface treatment and electrochemical deposition; (d) treating the first conductive layer using a hydrogen radical H* surface treatment in a treatment chamber of the plating tool to produce a treated first conductive layer; and (e) maintaining the workpiece in the same plating tool and depositing a second conductive layer in the feature on the treated first conductive layer in an electrochemical deposition chamber of the plating tool.

In accordance with another embodiment of the present disclosure, a method for metal deposition on a workpiece is provided. The method includes (a) obtaining a workpiece including a feature having a feature size may be of less than 50 nm; (b) depositing a seed layer in the feature, wherein the seed layer is selected from the group consisting of CVD cobalt, CVD ruthenium, and PVD, ALD, and CVD copper; (c) moving the workpiece to an integrated electrochemical deposition plating tool configured for hydrogen radical H* surface treatment and electrochemical deposition; (d) treating the seed layer using a hydrogen radical H* surface treatment in a treatment chamber of the plating tool to produce a treated first conductive layer; and (e) maintaining the workpiece in the same plating tool and depositing a metal layer in the feature on the seed layer in an electrochemical deposition chamber of the plating tool.

In any of the methods described herein, treating the first conductive layer may include treatment with hydrogen radicals H* generated in a plasma chamber.

In any of the methods described herein, wherein treating the first conductive layer may include treatment with hydrogen radicals H* generated by a hot filament.

In any of the methods described herein, the first conductive layer may be selected from the group consisting of cobalt, ruthenium, copper, nickel, copper manganese, copper cobalt, copper aluminum, copper nickel, and alloys thereof.

In any of the methods described herein, the first conductive layer may be less than 300 Å.

In any of the methods described herein, the feature size may be less than 50 nm.

In any of the methods described herein, the feature further may include a barrier layer or an adhesion enhancement layer deposited prior to depositing the first conductive layer.

In any of the methods described herein, the hydrogen radical H* surface treatment may reduce oxides formed on the first conductive layer.

In any of the methods described herein, the hydrogen radical H* surface treatment may remove residual carbon from the surface of the first conductive layer.

In any of the methods described herein, the hydrogen radical H* surface treatment may be conducted in a temperature range of room temperature to about 250° C.

In any of the methods described herein, the hydrogen concentration in the hydrogen radical H* chamber may be in the range of 2% to 10%.

In any of the methods described herein, the hydrogen concentration in the hydrogen radical H* chamber may be 100%.

In any of the methods described herein, the hydrogen radical H* surface treatment may be conducted in a pressure range of 10 mT to 200 mT.

In any of the methods described herein, the hydrogen radical H* surface treatment may be conducted in a pressure range of atmospheric or sub-atmospheric.

In any of the methods described herein, the temperature of the hot filament may be greater than 1000° C.

In any of the methods described herein, the hydrogen radical H* surface treatment may be conducted in a power range of 400 W to 1200 W.

In any of the methods described herein, further comprising annealing the workpiece in the treatment chamber of the plating tool.

In any of the methods described herein, the workpiece may be exposed to a nitrogen environment after the deposition of a first conductive layer in the feature and before hydrogen radical H* surface treatment.

In any of the methods described herein, the workpiece may be exposed to a nitrogen environment after hydrogen radical H* surface treatment and before the deposition of a second conductive layer in the feature on the treated first conductive layer.

In any of the methods described herein, oxidation of the first conductive layer may be mitigated by exposure to a nitrogen environment.

DESCRIPTION OF THE DRAWINGS

The foregoing aspects and many of the attendant advantages of the disclosure will become more readily appreciated by reference to the following detailed description, when taken in conjunction with the accompanying drawings, wherein.

DETAILED DESCRIPTION

Figure 1:
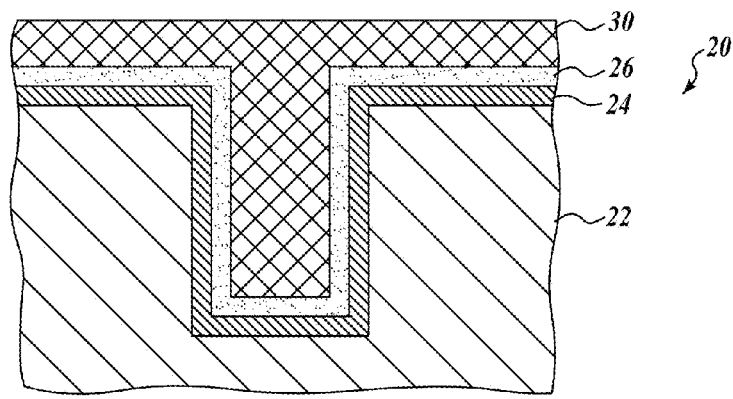
FIG. 1 schematically illustrates a cross-sectional representation of a micro-feature workpiece in accordance with one embodiment of the present disclosure.

The present disclosure relates to methods for electrochemically depositing a conductive material, for example, a metal, such as copper (Cu), cobalt (Co), nickel (Ni) gold (Au), silver (Ag), manganese (Mn), tin (Sn), aluminum (Al), and alloys thereof, in features (such as trenches and vias, particularly in Damascene applications) of a microelectronic workpiece.

Embodiments of the present disclosure are directed to workpieces, such as semiconductor wafers, devices or processing assemblies for processing workpieces, and methods of processing the same. The term "workpiece," "wafer," or "semiconductor wafer" means any flat media or article, including semiconductor wafers and other substrates or wafers, glass, mask, and optical or memory media, MEMS substrates, or any other workpiece having micro-electric, micro-mechanical, or microelectro-mechanical devices.

Methods in accordance with the present disclosure are generally directed to methods of forming micro-feature workpieces having improved seed layers with oxide and carbon contamination removed. An exemplary schematic of a workpiece constructed in accordance with methods of the present disclosure may be best understood by referring to FIG. 1. The exemplary workpiece 20 generally includes a substrate 22 having a barrier layer 24, a seed layer 26 on the barrier layer 24, and a metal layer 30 on the seed layer 26. In accordance with embodiments of the present disclosure, the layer illustrated and described as a seed layer 26 may be a first conducting layer, and the layer illustrated and described as a metal layer 30 may be a second conducting layer.

Methods described herein are to be used for metal or metal alloy deposition in features of workpieces, including trenches and vias. In one embodiment of the present disclosure, the process may be used in small features, for example, features having a feature diameter of less than 50 nm. However, the processes described herein are applicable to any feature size. The dimension sizes discussed in the present application are post-etch feature dimensions at the top opening of the feature. In one embodiment of the present disclosure, Damascene features may have a size of less than 50 nm. In another embodiment, Damascene features may have a size of less than 40 nm. In another embodiment, Damascene features may have a size of less than 30 nm.

The descriptive terms "micro-feature workpiece" and "workpiece" as used herein include all structures and layers previously deposited and formed at a given point in the processing, and is not limited to just those structures and layers as depicted in FIG. 1.

Although generally described as metal deposition in the present application, the term "metal" also contemplates metal alloys. Such metals and metal alloys may be used to form seed layers or to fully or partially fill the feature. As a non-limiting example, the alloy composition ratio may be in the range of about 0.5% to about 6% secondary alloy metal, as compared to the primary alloy metal.

Figure 2A:
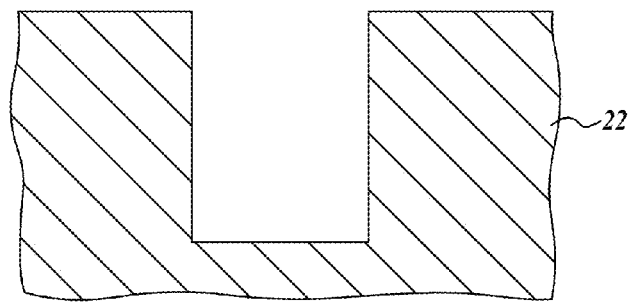
FIGS. 2A-2E schematically illustrate a sequence of processes corresponding to an exemplary method of forming the workpiece of FIG. 1, as described herein.

The workpiece 20 depicted in FIG. 2A provides a starting point for understanding some of the novel aspects of the disclosure. A method of forming a metal layer 30 on a workpiece 20 in accordance with one embodiment of the present disclosure may be best understood by referring to the sequence of processes depicted in FIGS. 2A-2E to produce the workpiece 20 depicted in FIG. 1. The illustrated method generally includes providing a substrate layer 22 (FIG. 2A), depositing a barrier layer 24 on the substrate layer 22 (FIG. 2B), depositing a seed layer 26 on the barrier layer 24 (FIG. 2C) including native oxide layer 28 on the seed layer, reducing oxides on the seed layer 26 and cleaning the seed layer 26 of impurities (FIG. 2D) to provide a treated seed layer 26 (see FIG. 2E), and depositing a metal layer 30 on the cleaned seed layer (26 and 28) (return to FIG. 1).

Figure 2B:
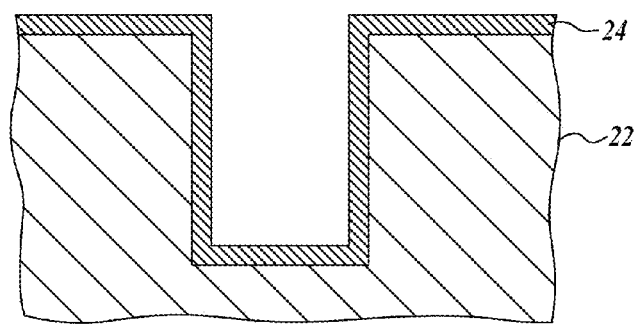

Comparing FIGS. 2A and 2B, an exemplary deposition of the barrier layer 24 on the substrate layer 22 is illustrated. The substrate layer 22 may be any suitable substrate layer including, but not limited to, a silicon oxide layer, a silicate layer, a low-K dielectric layer, or an air gap silicon oxide layer. The barrier layer 24 limits metal diffusivity (e.g., copper diffusivity) to chemically isolate a metal conductor 30 (see FIG. 1) from the substrate 22. Suitable barrier layer materials generally have low electrical conductivity, and may include, but are not limited to, tantalum nitride, titanium nitride, manganese, tungsten, tungsten carbide, tungsten nitride, manganese silicate, and manganese nitride.

The conventional fabrication of metal interconnects may include a suitable deposition of a barrier layer on the dielectric material to prevent the diffusion of copper into the dielectric material. Suitable barrier layers include, for example, Ta, Ti, TiN, TaN, Mn, or MnN. Barrier layers are typically used to isolate copper or copper alloys from dielectric material. However, in the case of other metal interconnects, diffusion may not be a problem and a barrier layer may not be required. In the case of a cobalt seed layer, a barrier layer may not be needed. Instead, a TiN adhesion enhancement liner may be used to enhance adhesion between the substrate and the cobalt seed layer.

Although the exemplary workpiece 20 illustrated in FIG. 1 includes both a barrier layer 24 and a seed layer 26, the barrier layer 24 may be optional. In accordance with embodiments of the present disclosure, the barrier layer and the seed layer may be combined into one layer. As a non-limiting example, ruthenium may be co-deposited with tantalum to form a combined barrier and seed layer. The barrier characteristics of the example are generally determined by the percentage of tantalum in the tantalum-ruthenium alloy, as one non-limiting example, from about 1 to about 10 percent tantalum. Therefore, in accordance with embodiments of the present disclosure, the first conducting layer of a workpiece may be a combination barrier and seed layer, such as a ruthenium tantalum layer, and the second conducting layer may be a metal layer, such as a copper layer.

One drawback of using a barrier layer in a metal plating process is a difficulty in plating metal, such as copper, on typical barrier layer materials. Therefore, an intermediate seed layer can be used to initiate the nucleation and improve metal adhesion for plating, as described with reference to FIG. 2C below. As described above, a combination seed and barrier layer may also be suitable for plating, in accordance with embodiments of the present disclosure.

The barrier layer 24 of the illustrated embodiment is formed on a substrate 22, as depicted in FIG. 1; however, barrier layers formed on substrate layers of workpieces are also within the scope of the present disclosure. As non-limiting examples, barrier layers can be formed on gate, source, and drain regions of a workpiece. Accordingly, the terms "substrate" and "substrate layer" can be used interchangeably throughout the present disclosure.

Figure 2C:
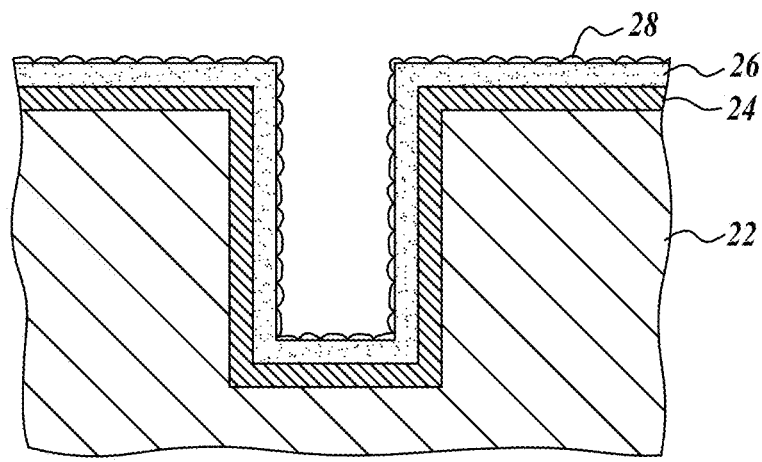

The barrier layer deposition may be followed by an optional seed layer 26 deposition. Referring to FIG. 2C, an exemplary deposition of the seed layer 26 on the barrier layer 24 is illustrated. As seen in FIG. 2C, the seed layer 26 forms a native oxide layer 28 immediately after deposition.

In the case of depositing metal in a feature, there are several options for the seed layer. For example, the seed layer may be (1) a conventional seed layer (as a non-limiting example, a PVD copper seed layer). The seed layer may be a metal layer, such as copper, cobalt, nickel, gold, silver, manganese, tin, aluminum, ruthenium, and alloys thereof. The seed layer may also be (2) a stack film of a liner layer and a seed layer (as a non-limiting example, a CVD Co or Ru liner layer and a PVD copper seed layer), or (3) a secondary seed layer (as a non-limiting example, a CVD or ALD Co or Ru secondary seed layer). Other methods of depositing exemplary seed layers are also contemplated by the present disclosure.

In one non-limiting example, a typical seed layer is a copper seed layer. As other non-limiting examples, the seed layer may be a copper alloy seed layer, such as copper manganese, copper cobalt, copper aluminum, and copper nickel alloys. In the case of depositing copper in a feature, there are several exemplary options for the seed layer. First, the seed layer may be a PVD copper seed layer. The seed layer may also be formed by using other deposition techniques, such as CVD or ALD.

A liner layer is a material used in between a barrier layer and a seed layer to mitigate discontinuous seed issues and improve adhesion of the seed layer. Liners are typically noble metals such as Ru, Pt, Pd, and Os, but the list may also include Co and Ni. Currently, CVD Ru and CVD Co are common liners; however, liner layers may also be formed by using other deposition techniques, such as PVD or ALD. The thickness of the liner layer may be in the range of around 5 Å to 50 Å for Damascene applications.

A secondary seed layer is similar to a liner layer and is typically formed from the same metals and the same deposition processes. The difference is the secondary seed layer serves as the seed layer, whereas the liner layer is an intermediate layer between the barrier layer and the seed layer.

The seed layer deposit may be thermally treated or annealed at a temperature between about 100° C. to about 500° C. in a forming gas environment (e.g., 3%-5% hydrogen in nitrogen or 3%-5% hydrogen in helium) to remove any surface oxides, increase the density of the secondary seed or liner layer, and improve the surface properties of the deposit. The liner or secondary seed deposit may additionally be passivated by the soaking in gaseous nitrogen (N2 gas) or other passivating environments to prevent or mitigate further surface oxidation.

Figure 3:
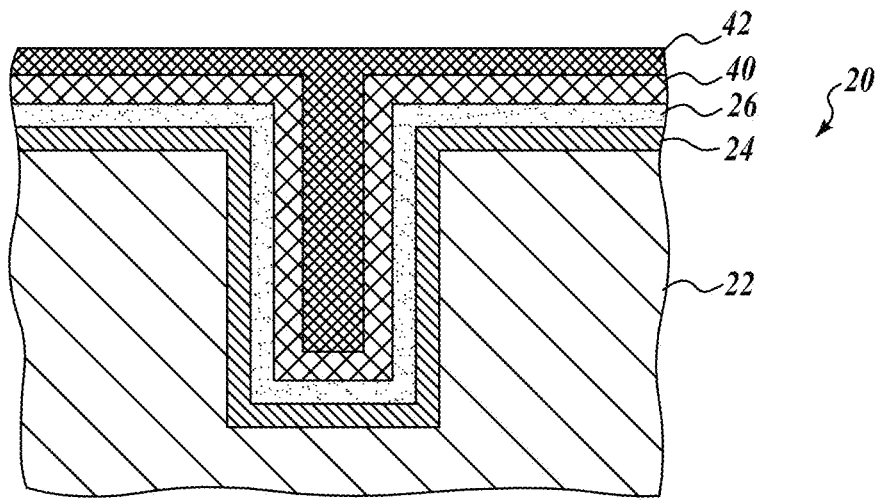
FIG. 3 schematically illustrates a cross-sectional representation of a micro-feature workpiece in accordance with another embodiment of the present disclosure.

Suitable seed layers are generally formed by CVD or PVD processes as described above, but may also be formed by wet seed plating. Wet seed plating is generally known in the art as a non-traditional plating technique using an alkaline plating bath (as opposed to an acidic plating bath) to plate a thin conformal "wet seed" layer of metal before gap filling metal using a traditional acid plating bath. An exemplary workpiece plated using a "wet seed" metal plating process is shown in FIG. 3. The exemplary workpiece generally includes a substrate 22 having a barrier layer 24, a seed layer 26 on the barrier layer 24, a wet seed metal layer 40 on the seed layer 26 and a subsequent metal layer 42 plated on the wet seed layer 40. In one embodiment of the present disclosure, the wet seed layer may have a thickness in the range of about 1 to about 5 nanometers.

Referring to FIG. 1, after a seed layer has been deposited (such as one of the non-limiting examples of PVD copper seed, PVD copper seed including CVD Ru liner, or CVD Ru secondary seed, or another deposition metal or metal alloy, layer combination, or deposition technique), the feature may include a metal layer 30 deposited after the seed layer. In some embodiments, the metal layer 30 may be a copper metallization layer. In other embodiment, the metal layer 30 may be a cobalt metallization layer.

In previously developed processes, a copper seed layer was formed, for example, using a PVD process, prior to a copper plating process. Because of PVD process limitations, copper seed layers usually deposit a certain thickness of at least 20 nanometers to have step coverage on the feature wall and be reliable and effective as seed layers. Such thickness often results in an enhanced overhang at the feature opening. The overhang impedes electrochemically plating copper using a copper damascene fill process in smaller-sized features, for example, features having a width value on the order of less than about 1 micron, or more preferably, less than about 50 nanometers.

Recently, other metals besides copper, such as ruthenium and cobalt have been introduced as suitable alternatives seed layer material to a copper seed layer. Advantageously, the ruthenium and cobalt seed layers can be formed by CVD or ALD processes, resulting in a nearly conformal layer with a smooth surface. In addition, embodiments of the present disclosure provide advantages in plating over copper seed layers to allow for a better interface between the plated copper and copper seeds deposited by CVD or ALD processes.

One drawback of the seed layer, as mentioned above, is the tendency to oxidize quickly, and such oxidation may degrade metal (e.g., copper) deposition on the seed layer. Another drawback is that an oxidized surface tends to increase defects and may degrade the reliability of the interconnect. Such oxides should therefore be reduced prior to metal deposition, for example, in the exemplary processes illustrated in FIGS. 2C-2E. In previously developed processes, oxide reduction included one or more of a high-temperature, reducing gas anneal, an electrolytic cleaning process, for example, using a strong acid and an electric charge to reduce the oxide layer, and other processes for providing a substantially fresh metal surface.

As mentioned above, oxide reduction and removal of contaminants on the seed layer can be achieved by subjecting the seed layer 26 to an annealing process in the presence of a reducing gas. One suitable example of a reducing gas is hydrogen. The reducing gas may be mixed with an inert gas (for example, nitrogen, argon, or helium), wherein the reducing gas amount may be in the range of about 2 to about 100 percent of the mixture. As a non-limiting example, the reducing gas may be a mixture of 2% hydrogen and 98% helium. In one suitable oxide reduction process, the reducing gas anneal is performed at a temperature of about 300-400 degrees C. for about 2-5 minutes. The hydrogen in the reducing gas combines with the oxygen in the oxides to form water as a by-product of the oxide reduction process.

The drawback of the traditional approach of annealing in the presence of a reducing gas is the annealing temperature of greater than 300° C., higher than the thermal budget of thin seed layer and therefore can cause agglomeration, de-wetting, or beading of the seed material, rendering it discontinuous.

Figure 2D:
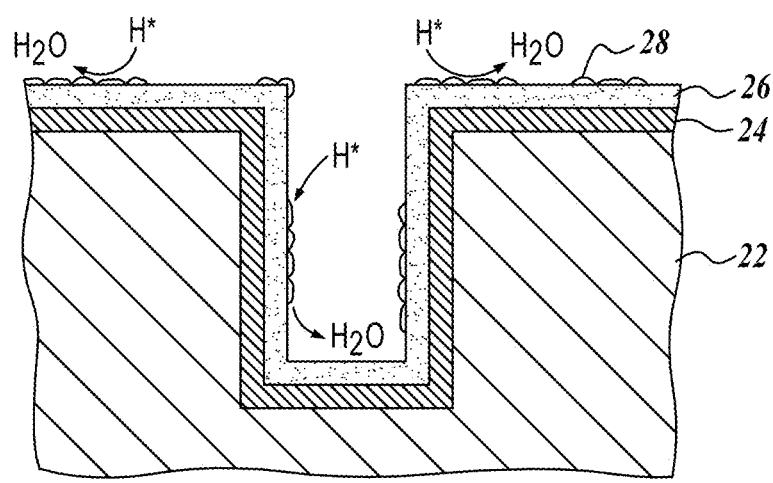
Figure 2E:
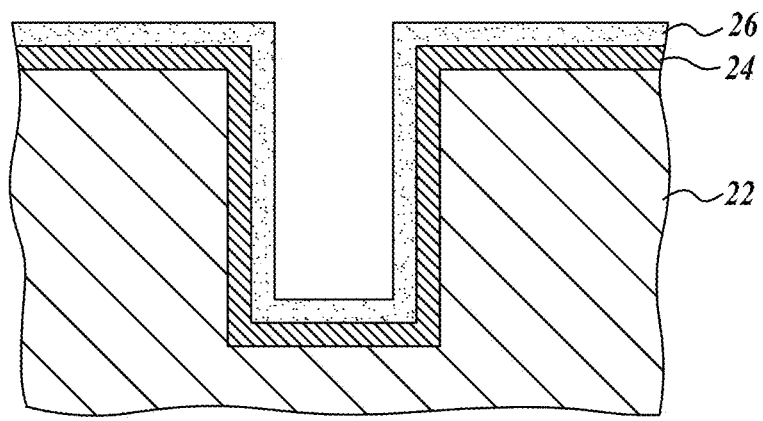

In accordance with embodiments of the present disclosure, surface treatment can be achieved using a low temperature surface treatment method so as to maintain the integrity and continuity of the deposited seed layer and minimize damage to the seed layer. Referring to FIG. 2D, in one embodiment of the present disclosure, the seed layer is treated with hydrogen radicals H*. The hydrogen radicals H* is used to reduce metal oxides back to metal and covert the oxides to water. The hydrogen radical H* can also be used to clean contaminants from the seed layer surface, such as carbon.

In accordance with embodiments of the present disclosure, the hydrogen radicals H* may be generated using a plasma chamber, using a hot-filament radical source, or a combination of both. The hydrogen radicals H* can be used to uniformly reduce oxides and clean the seed layer surface in the feature.

Advantageous effects of hydrogen radical H* surface treatment in accordance with embodiments of the present disclosure include reduced agglomeration of the conductor layers and/or reduced changes to the intrinsic properties of the seed layer were typically caused by high temperature treatments in previously developed processes. Another advantageous effect of surface treatment includes enhances nucleation of the plated conductor as a result of the surface treatment to reduce oxygen and other contaminants.

Figure 4:
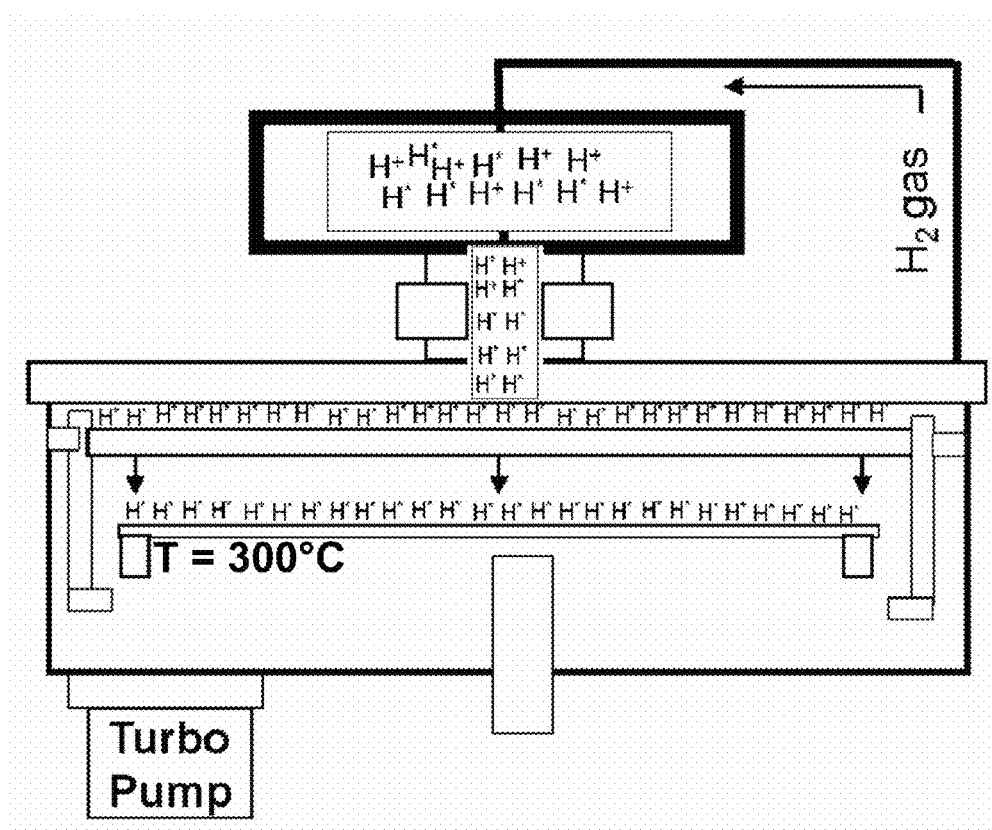
FIG. 4 schematically illustrates a hydrogen ion plasma chamber for use with methods in accordance with embodiments of the present disclosure.

Referring to FIG. 4, hydrogen radical H* generation in a plasma chamber will now generally be described in detail. Plasma in micro-processing is used to generate ions and radicals through inelastic collisions between neutral molecules and high-energy electrons. The generated ions are accelerated by an electric field toward the workpiece to sputter the oxides and contaminants away.

In one embodiment of the present disclosure, in the plasma chamber, hydrogen ion radical plasma is created remotely. The hydrogen ions are filtered in applicator tube by an ion filter. The reactive H* radicals enter the chamber body. Hydrogen radicals H* pass through an optimized showerhead for lowest on-wafer non-uniformity for metal oxide reduction. The heated pedestal in the chamber maximizes process efficiency with optimized process variables.

The advantageous effect of allowing the H* radical in the plasma, but to filter out the ions, is a plasma that can react with carbon and oxide impurities on the sides of the feature. In contrast, ions are generally directed toward the bottom of the feature, and therefore, sputter the film at the bottom only.

The primary purpose for plasma applications is to generate ions and radicals through the inelastic collisions between high energy electrons and neutral molecules in the gas phase. The generated ions are accelerated by an electric field toward the workpiece and sputter the surface. The sputtering is purely a physical process and sputtering can also be used for etching in addition sputter deposition. Sputter-based cleaning is generally undesirable because it tends to remove seed layer materials, particularly at the bottoms of the features. In addition, ions are incapable of effectively cleaning the sides of the features as a result of the trajectory nature of the charged ions under the influence of the electrical field.

Radicals, on other hand, are species with an unshared electro pair and reactive. Therefore, radicals elicit a spontaneous chemical reaction. Because of a lack of charge, however, radicals do not accelerate toward the workpiece. Therefore, radicals can be used to clean the side walls and the bottoms of the features.

H* radicals can also be generated by hot-filament source, for example, a refractory metal wire that is heated to a high temperature. At the surface of the wire, the dissociation of molecules is catalytically promoted to form radicals. The radical formation process is a pyrolytic process and therefore eliminates energetically charged ions that might damage the seed layer materials.

In a hot-filament radical source, a hot filament, such as a tungsten wire can be electrically heated at a high temperature, e.g., above 1000° C., 1200° C., or in the range of 1200°–2000° C. in a hydrogen ambient to generate hydrogen radicals H*. A pressure differential can be used to drive the hydrogen radicals H* to the seed layer surface.

Regardless of the source of hydrogen radicals H*, the treatment can be conducted at low temperature, as compared to a high-temperature surface anneal to reduce oxides. In one embodiment of the present disclosure, hydrogen radical H* surface treatment may be achieved using a processing temperature in the range of room temperature to 300° C. In another embodiment of the present disclosure, surface treatment may be achieved using a processing temperature in the range of room temperature to 200° C. In one embodiment, the processing temperature is room temperature. In another embodiment, the processing temperature is 180° C. In another embodiment of the present disclosure, surface treatment may be achieved using a processing temperature in the range of room temperature to 100° C. In another embodiment of the present disclosure, surface treatment may be achieved using a processing temperature in the range of room temperature to 50° C. Low temperature surface treatment may be effective in reducing damage to the seed layer.

Experimental results have shown hydrogen radical H* reduction of oxides is achieved at room temperature. However, a temperature elevation, for example, to 180° C. improves the removal of carbon impurities from the seed layer.

In some embodiments of the present disclosure, a suitable pressure range for the hydrogen radical source H* may be in the range of 10 mT to 200 mT. The advantageous effect of operating the chamber at a pressure higher than atmospheric pressure is contaminants can be kept from entering the plating chamber. In other embodiments, the pressure in the plasma chamber may be sub-atmospheric or atmospheric.

In some embodiments of the present disclosure, a suitable hydrogen radical H* concentration is in the range of about 2% to 10%. The remainder of the environment may be helium or another inert gas. In other embodiments, the hydrogen radical H* may not require a carrier gas, having a hydrogen radical H* concentration of 100% or close to 100%.

In some embodiments of the present disclosure, a suitable power range for the hydrogen radical source H* may be in the range of 400 W to 1200 W.

After surface treatment by hydrogen radicals H*, a short processing window between surface treatment and electrochemical deposition, re-oxidation of the seed layer surface is significantly reduced. Accordingly, in some embodiments of the present disclosure, the time range between seed layer surface treatment and metallization layer deposition is less than 60 seconds. In other embodiments, the time range may be less than 30 seconds. In some embodiments, re-oxidation of the seed layer may be mitigated by storing the workpiece in a nitrogen environment (or another passivating environment) before plasma surface treatment, after plasma surface treatment, or during other intervals in workpiece processing.

In comparison, typical a plating window after a copper seed deposition process is in the range of about 12-24 hours, generally considered by the industry to be an acceptable time period for plating interconnect metal on a copper seed layer. Moreover, copper seed layer surface treatment in accordance with the processing methods described herein may have the effect of improving adhesion, reducing defects, improving interconnect reliability, and other properties for subsequent copper metallization layers.

Figure 5:
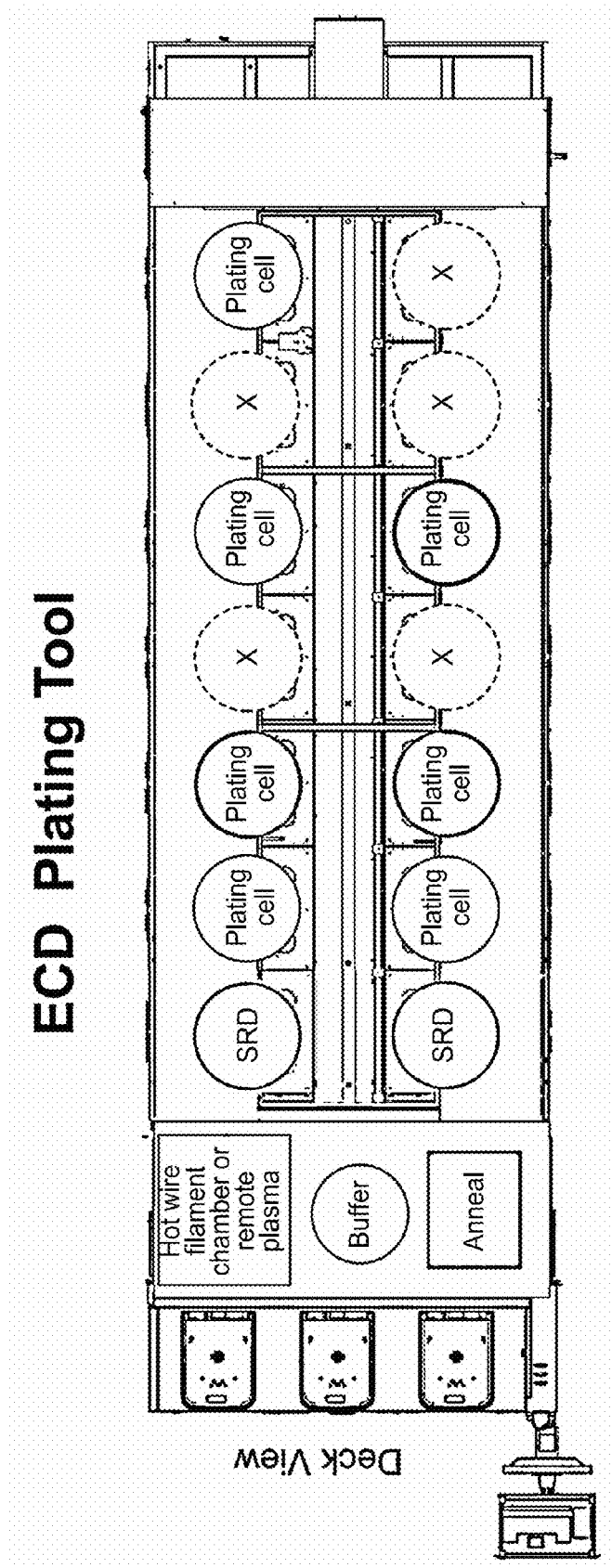
FIG. 5 schematically illustrates an electrochemical deposition plating tool for use with methods in accordance with another embodiment of the present disclosure.

To achieve the short processing window, advances have been made to the plating tool. Referring to FIG. 5, an exemplary plating tool for use with methods described herein in shown. In the illustrated embodiment, a deck view of an exemplary RAIDER® plating tool manufactured by APPLIED Materials, Inc., is provided including several plating cells, spin-rinse-dry chambers, and a hydrogen radical H* generation chamber. By including the hydrogen radical H* generation chamber in the plating tool, the time range between seed layer surface treatment and metallization layer deposition can be 60 seconds or less.

Figure 8:
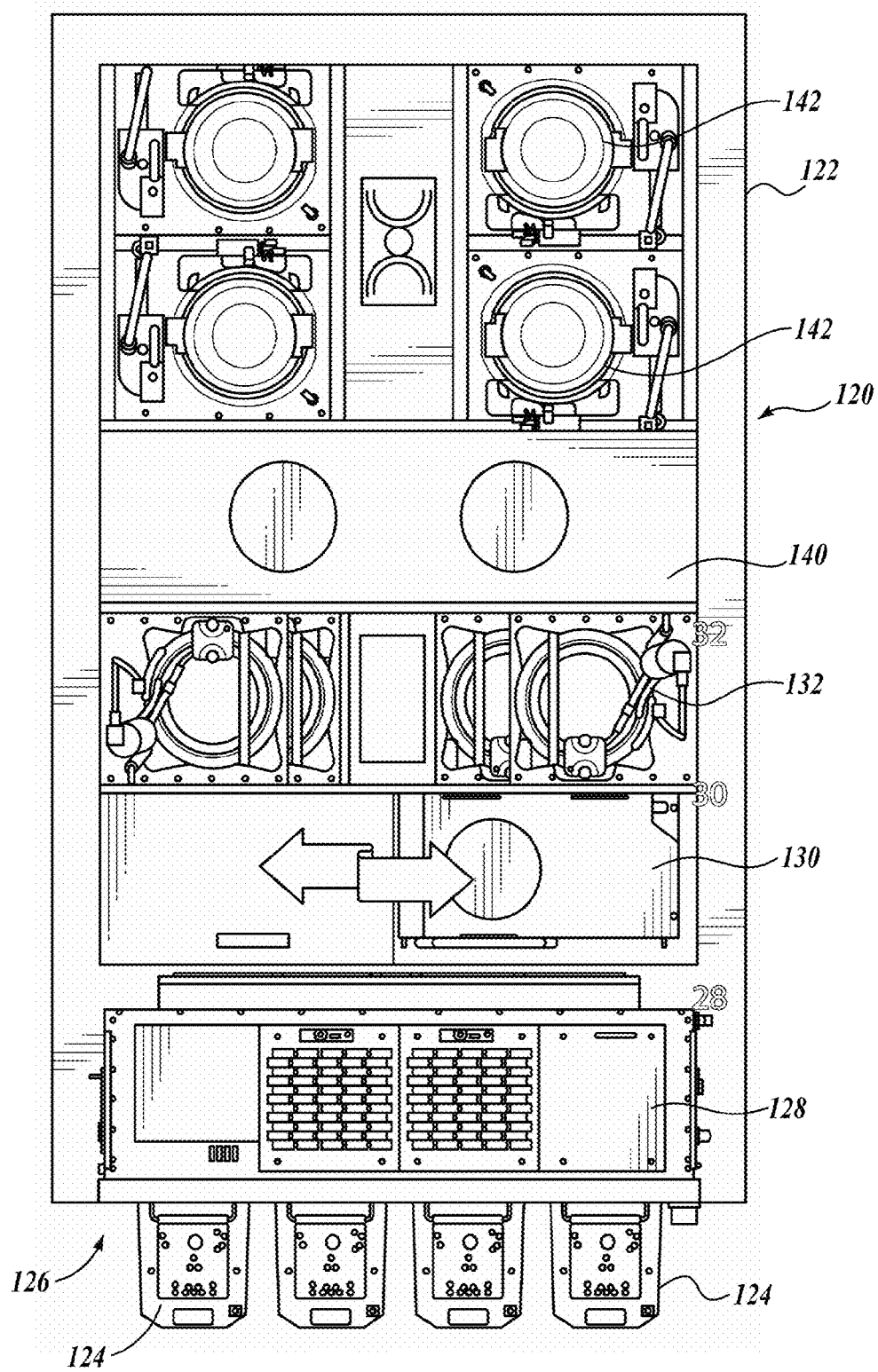
FIG. 8 schematically illustrates another electrochemical deposition plating tool for use with methods in accordance with another embodiment of the present disclosure.

Another exemplary embodiment of an exemplary plating tool, commonly known as the MUSTANG® tool manufactured by APPLIED Materials, Inc., is shown in FIG. 8. The tool of FIG. 8 includes modules or subsystems within an enclosure 122. Wafer or substrate containers 124, such as FOUP (front opening unified pod) containers, may be docked at a load/unload station 126 at the front of the enclosure 122. The subsystems used may vary with the specific manufacturing processes performed by the system 120. In the illustrated embodiment, the system 120 includes a front interface 128 which may provide temporary storage for wafers to be moved into or out of the system 120, as well as optionally providing other functions. As non-limiting examples, the system 120 may include an anneal module 130, a hydrogen radical H* generation chamber, a rinse/dry module 132, a ring module 140, and electroplating chambers 142, which may be sequentially arranged within the enclosure 122 behind the front interface 128. Robots move the wafers between the subsystems.

In some embodiments of the present disclosure, the tool may have an ambient air environment between chambers. In other embodiments, the tool may have an nitrogen environment in the enclosure between chambers to mitigate oxidation of the seed layer before plasma surface treatment, after plasma surface treatment, or during other intervals in workpiece processing.

In some embodiments of the present disclosure, the tool may include separate annealing and hydrogen radical H* generation chambers. In other embodiments of the present disclosure, the hydrogen radical H* generation may occur in the same chamber as is used for an annealing process. Although the same chamber may be used for both processes, the processes will occur separately in the workpiece manufacturing process, and not at the same time. To accommodate both processes, the chamber will have both hydrogen radical H* generation capabilities and annealing capabilities. In one embodiment, the chamber accommodates a temperature range from room temperature to 300° C. or room temperature to 400° C.

The combination of hydrogen radical H* generation and annealing in one processing chamber reduces that manufacturing site foot print of the tool and provides for annealing at high temperature and high vacuum, which may prove to be of benefit to the seed layer.

In some embodiments of the present disclosure, the metallization layer may be a copper metallization layer. In other embodiments of the present disclosure, the metallization layer may be a cobalt metallization layer. The metal options of the seed and metallization layers are described above. Embodiments of the present disclosure include, for example, a cobalt seed layer and a cobalt metallization layer and a copper seed layer and a copper metallization layer. In these non-limiting examples, there is no distinguishable interface between seed and metallization layers upon reduction of the oxide layer as described herein.

In addition, cobalt and nickel are emerging as alternatives to copper interconnect metallization. For those metals, cobalt or nickel seeds may be used.

Example 1

Hydrogen Plasma Treated Wafer

Treatment and control wafers each received a 40 A PVD TaN barrier layer and a 25 A CVD Co seed. Wafers were left for 24 hours at ambient temperature and pressure. The treatment wafer was treated with hydrogen plasma (about 2% H2 in He) for 60 seconds at 250 C set point temperature. The queue time between plasma treatment and plating was less than one hour. The treated wafer was stored in a nitrogen purged storage pod for transportation and storage.

The control wafer was not stored in a nitrogen purged storage pod for transportation and storage and was not treated using H2 plasma.

Both plasma treated Co wafer and the control Cu wafers were plated using a charge of 2 A·min of ECD Seed Cu followed by an annealing process at 250° C. for 1 minute. All wafers were capped with conventional acid chemistry NP5200.

Figure 6A:
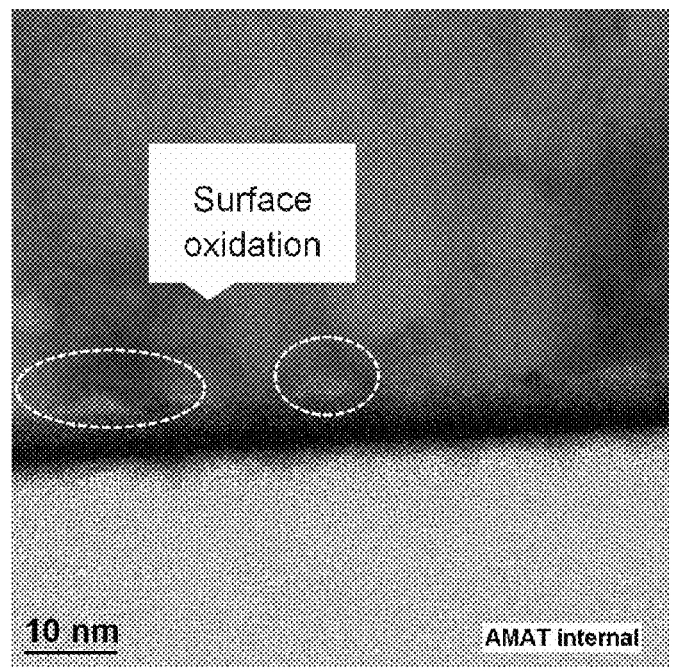
FIGS. 6A and 6B are comparative TEM images of wafers plated according to previously developed processes (FIG. 6A) and according to embodiments of the present disclosure (FIG. 6B)
Figure 6B:
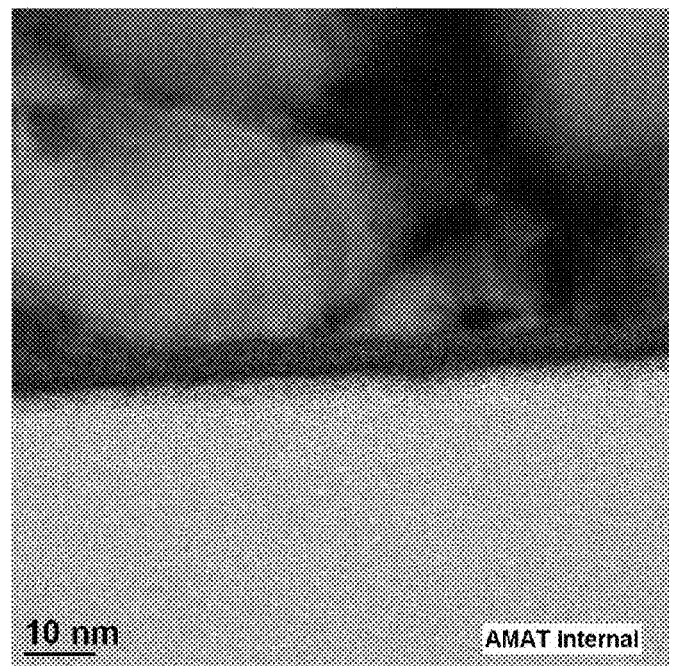

Referring to FIGS. 6A and 6B, TEM images are provided comparing plasma treated and non-treated Co seed surfaces. Surface oxidation appears on the control (untreated) CVD Co layer (see FIG. 6A), whereas there is a clean interface between the plasma treated CVD Co film and the plated Cu layer (see FIG. 6B).

Example 2

Tem Images for 5× Trenches

Figures 7A, 7B, 7C:
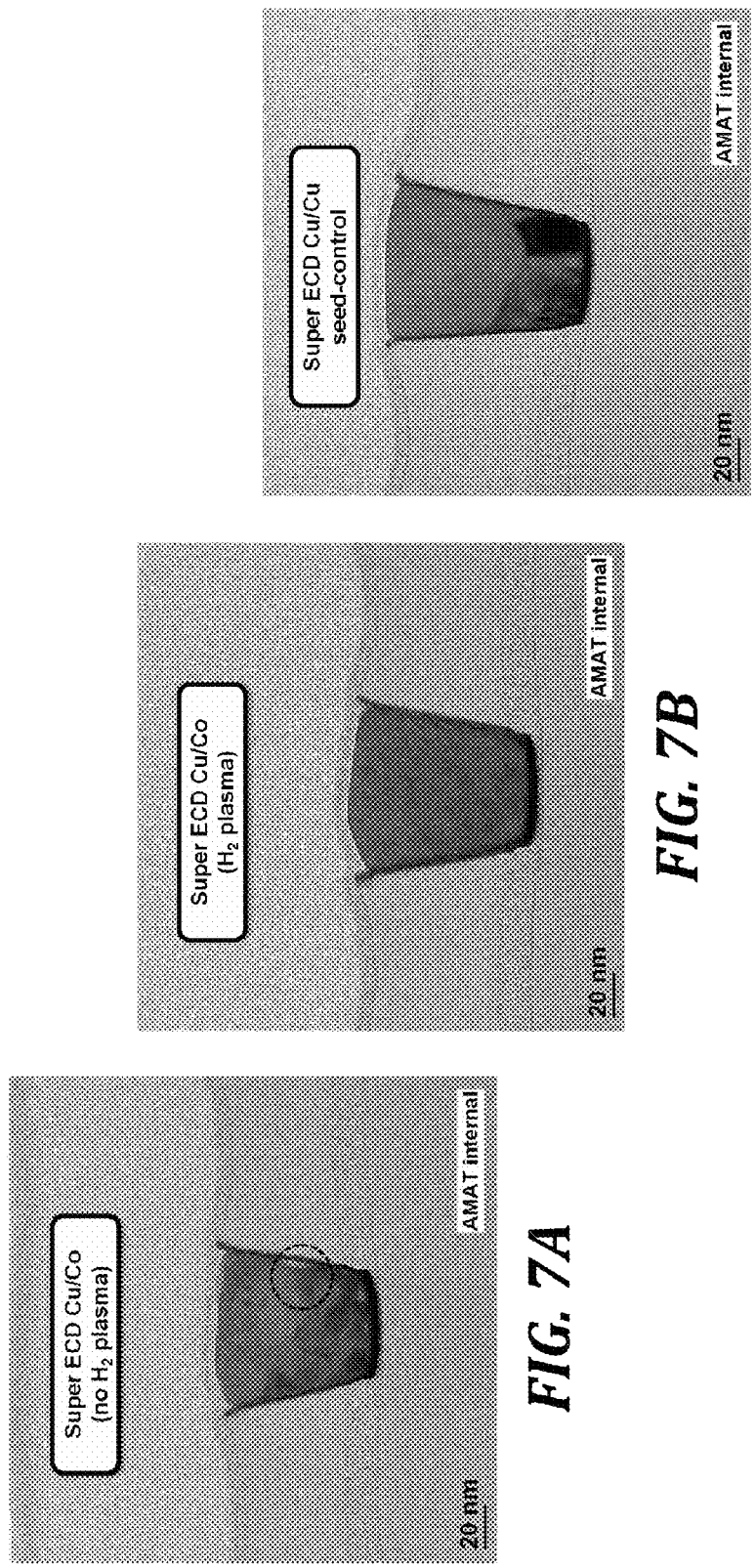
FIGS. 7A, 7B, and 7C are comparative TEM images of wafers plated according to previously developed processes (FIGS. 7A and 7C) and according to embodiments of the present disclosure (FIG. 7B)

A comparison of Super ECD Cu/Co (no hydrogen plasma), Super ECD Cu/Co (with hydrogen plasma), and Super ECD Cu/Cu seed control results are provided in FIGS. 7A, 7B, and 7C.

For the untreated Co film, voids are seen hear the interface of the seed and the Cu fill. Wafers with hydrogen plasma treated CVD Co film and control showed a good interface between the seed layer and the Cu fill.

While illustrative embodiments have been illustrated and described, various changes can be made therein without departing from the spirit and scope of the disclosure.

The embodiments of the disclosure in which an exclusive property or privilege is claimed are defined as follows:

1. A method for metal deposition on a workpiece, the method comprising:
   receiving a workpiece in an integrated electrochemical deposition plating tool configured for hydrogen radical H* surface treatment and electrochemical deposition, the workpiece including a nonmetallic substrate and a dielectric layer disposed over the nonmetallic substrate and a continuous first conductive layer disposed on the dielectric layer and having one or more microfeatures comprising recessed structures;
   treating the first conductive layer using a hydrogen radical H* surface treatment in a treatment chamber of the plating tool to produce a treated first conductive layer;
   exposing the workpiece to a nitrogen environment after hydrogen radical H* surface treatment and before the deposition of a second conductive layer in the feature on the treated first conductive layer; and
   maintaining the workpiece in the same plating tool and depositing the second conductive layer in the feature on the treated first conductive layer in an electrochemical deposition chamber of the plating tool.

2. The method of claim 1, wherein treating the first conductive layer includes treatment with hydrogen radicals H* generated in a plasma chamber.

3. The method of claim 2, wherein treating the first conductive layer includes treatment with hydrogen radicals H* generated by remote plasma.

4. The method of claim 1, wherein treating the first conductive layer includes treatment with hydrogen radicals H* generated by a hot filament.

5. The method of claim 1, wherein the first conductive layer is selected from the group consisting of cobalt, ruthenium, copper, nickel, copper manganese, copper cobalt, copper aluminum, copper nickel, and alloys thereof.

6. The method of claim 1, wherein the first conductive layer has a thickness of less than 300 Å.

7. The method of claim 1, wherein the feature size is of less than 50 nm.

8. The method of claim 1, wherein the feature further includes a barrier layer or an adhesion enhancement layer deposited prior to the deposition of the first conductive layer.

9. The method of claim 1, wherein the hydrogen radical H* surface treatment reduces oxides formed on the first conductive layer.

10. The method of claim 1, wherein the hydrogen radical H* surface treatment removes residual carbon from the surface of the first conductive layer.

11. The method of claim 1, wherein the hydrogen radical H* surface treatment is conducted in a temperature range of room temperature to about 250° C.

12. The method of claim 1, wherein the hydrogen concentration in the hydrogen radical H* chamber is in the range of 2% to 10%.

13. The method of claim 1, wherein the hydrogen concentration in the hydrogen radical H* chamber is 100%.

14. The method of claim 1, wherein the hydrogen radical H* surface treatment is conducted in a pressure range of 10 mTorr to 200 mTorr.

15. The method of claim 1, wherein the hydrogen radical H* surface treatment is conducted in a pressure range of atmospheric or sub-atmospheric.

16. The method of claim 4, wherein the temperature of the hot filament is greater than 1000° C.

17. The method of claim 4, wherein the hydrogen radical H* surface treatment is conducted in a power range of 400 W to 1200 W.

18. A method for metal deposition on a workpiece, the method comprising:
   receiving a workpiece in an integrated electrochemical deposition plating tool configured for hydrogen radical H* surface treatment and electrochemical deposition, the workpiece including a nonmetallic substrate and a dielectric layer disposed over the nonmetallic substrate and a continuous first conductive layer disposed on the dielectric layer and having one or more microfeatures comprising recessed structures;
   exposing the workpiece to a nitrogen environment;
   treating the first conductive layer that has been exposed to a nitrogen environment using a hydrogen radical H* surface treatment in a treatment chamber of the plating tool to produce a treated first conductive layer;
   exposing the workpiece to a nitrogen environment after hydrogen radical H* surface treatment and before the deposition of a second conductive layer in the feature on the treated first conductive layer; and
   maintaining the workpiece in the same plating tool and depositing the second conductive layer in the feature on the treated first conductive layer in an electrochemical deposition chamber of the plating tool.

* * * * *